(12) United States Patent
Hirota et al.

(10) Patent No.: US 7,888,726 B2
(45) Date of Patent: Feb. 15, 2011

(54) CAPACITOR FOR SEMICONDUCTOR DEVICE

(75) Inventors: Toshiyuki Hirota, Tokyo (JP); Masami Tanioku, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 362 days.

(21) Appl. No.: 12/195,884

(22) Filed: Aug. 21, 2008

(65) Prior Publication Data

US 2009/0057738 A1 Mar. 5, 2009

(30) Foreign Application Priority Data

Aug. 31, 2007 (JP) ............................ 2007-225765

(51) Int. Cl.
*H01L 27/108* (2006.01)
*H01L 21/8242* (2006.01)

(52) U.S. Cl. ............... 257/310; 257/532; 257/E21.008; 257/E27.034; 257/E27.048; 257/E27.084; 438/240

(58) Field of Classification Search ................. 257/296, 257/310, 532, E21.008, E27.034, E27.048, 257/E27.084; 438/240
See application file for complete search history.

(56) References Cited

FOREIGN PATENT DOCUMENTS

| JP | 2002-373945 A | 12/2002 |
|---|---|---|
| JP | 2004-511909 A | 4/2004 |
| JP | 2004-274067 A | 9/2004 |

*Primary Examiner*—Evan Pert
(74) *Attorney, Agent, or Firm*—Sughrue Mion, PLLC

(57) ABSTRACT

A capacitor for a semiconductor device having a dielectric film between an upper electrode and a lower electrode is featured in that the dielectric film includes an alternately laminated film of hafnium oxide and titanium oxide at an atomic layer level.

29 Claims, 13 Drawing Sheets

CAPACITOR FOR SEMICONDUCTOR DEVICE

BACKGROUND OF THE INVENTION

1. Field of the Invention

The present invention relates to a capacitor used in a semiconductor device. More particularly, the present invention relates to an improvement of a dielectric film in a capacitor of a DRAM (Dynamic Random Access Memory).

2. Related Art

One of cells in a DRAM includes one transistor and one capacitor. The capacitor includes a lower electrode, a dielectric film, and an upper electrode. With the size reduction in DRAMs, the surface area required for the cells has been reduced, and hence it has been investigated to employ a three-dimensional electrode structure and a dielectric film having a high dielectric constant in order to obtain a given amount of capacitor capacitance in the limited area.

As for the dielectric film, $Al_2O_3$ has until recently been used as a dielectric film of a capacitor for DRAM, because $Al_2O_3$ has a dielectric constant of about 9, and because it is possible to obtain from $Al_2O_3$ a film having, in the same EOT (Equivalent Oxide Thickness), a lower leakage current as compared with a previously used silicon nitride film (dielectric constant=7), and as compared with an ON film (a laminated structure of silicon dioxide film and silicon nitride film) which is obtained by oxidizing the nitride film to form the oxide film (dielectric constant=3.9) on the nitride film.

With the reduction of the device size, however, it has to use a dielectric film having a higher dielectric constant. As a dielectric film in a capacitor for 70 nm level of DRAM, even hafnium oxide ($HfO_2$) having a dielectric constant of 25 is not sufficient. Thus, in recent years, there has also been used a laminated film of $Al_2O_3$ and $HfO_2$, or the like, which is somewhat inferior in the dielectric constant, but which has a larger band gap than $HfO_2$ and is thereby capable of reducing leakage current in the same EOT. However, when such a film is used in an amorphous state, the effective dielectric constant of the film remains at about 20.

There has also been proposed a method in which yttrium (Y) is added to $HfO_2$ to lower the crystallization temperature and to increase the dielectric constant to about 40, and a method in which crystallized $ZrO_2$ (dielectric constant=about 40) is used as a dielectric. However, there is a problem of a phenomenon in which the leakage current is increased along with a transition from the amorphous state to the crystalline state.

Moreover, as a dielectric film having a further higher dielectric constant, an STO ($SrTiO_3$) film (dielectric constant=100 to 120), in which the crystal has a perovskite structure, has also been studied. However, there has not yet been obtained a desired precursor having a high vapor pressure as a source of strontium (Sr). Thus, such a film can be formed at a laboratory level, but an advanced film forming technique has not yet been established to a level applicable to mass production.

In addition, since a comparatively good precursor of Ti is commercially available, a $TiO_2$ (dielectric constant=about 80) film has been partly studied. However, similarly to the STO film, there is a problem that $TiO_2$ film has a narrow band gap and a large leakage current.

Further, there have also been studied laminated films of $TiO_2$ and $Al_2O_3$ which have structures as shown in FIG. 9, FIG. 10 and FIG. 11.

For example, to form the structure shown in FIG. 9, after lower electrode 901 is formed, dielectric films ($Al_2O_3$ layer: 902, $TiO_2$ layer: 903) are formed by an ALD (Atomic Layer Deposition) method. A sequence for forming the dielectric film by the ALD method is shown in FIG. 3. That is, in step 301, an Al precursor is injected into a reaction chamber of an ALD apparatus, and a monolayer film of Al compound is formed. After purging is performed (step 302), an oxidizing agent, such as ozone, is injected into the reaction chamber and a monomolecular layer of aluminum oxide is formed (step 303). Then, the inside of the reaction chamber of the apparatus is purged (step 304). The above described steps are performed as a cycle F for a required number of times, so that aluminum oxide layer 902 having a predetermined film thickness is formed. Similarly, in step 305, a Ti precursor is injected into the reaction chamber, so as to form a monolayer film of Ti compound, and then step 306 to step 308 are performed. These steps are performed as a cycle G for a required number of times, so that titanium oxide layer 903 having a predetermined film thickness is formed. Then, upper electrode 904 is formed. Note that in this specification, a cycle symbol on a loop arrow does not indicate the number of times n of a loop (n is zero or more), but indicates that respective steps surrounded by the loop arrow are successively performed as one cycle. The number of times at which the cycle is successively performed is represented by (n+1) times, that is, the first one loop added to the number n of loops.

Further, in the case where the structure shown in FIG. 10 is formed, after lower electrode 1001 is formed, dielectric films ($Al_2O_3$ layer: 1002, $TiO_2$ layer: 1003, $Al_2O_3$ layer: 1004) are formed by a film forming sequence of the ALD method as shown in FIG. 4, and then upper electrode 1005 is formed. That is, the inside of the reaction chamber of the ALD apparatus is purged with nitrogen gas in step 401, and an Al precursor is injected into the reaction chamber of the ALD apparatus (step 402), so that a monolayer film of aluminum compound is formed. After purging is performed (step 403), an oxidizing agent, such as ozone, is injected, and a monomolecular layer of aluminum oxide is formed (step 404). Then, the inside of the apparatus is purged (step 405). The above described steps are performed as a cycle H for a required number of times, so that aluminum oxide layer 1002 having a predetermined film thickness is formed. Similarly, a Ti precursor is injected in step 406, so as to form a monolayer film of Ti compound, and then step 407 to step 409 are performed. These steps are performed as a cycle I for a required number of times, so that titanium oxide layer 1003 having a predetermined film thickness is formed. Further, similarly to the cycle H, a cycle H' for repeating step 410 to step 413 is performed for a required number of times, so that aluminum oxide layer 1004 having a predetermined film thickness is formed. Thereafter, upper electrode 1005 is formed.

Similarly, it is also possible to form the structure (lower electrode: 1101, $TiO_2$ layer: 1102, $Al_2O_3$ layer: 1103, $TiO_2$ layer: 1104, upper electrode: 1105) as shown in FIG. 11.

However, the results of the tests performed by the present inventors show that in the structures as shown in FIG. 9, FIG. 10 and FIG. 11, the increase in dielectric constant cannot be sufficiently compatible with the reduction in leakage current as expected.

In addition, the following documents are listed as related techniques.

Patent Document 1 (Japanese Patent Laid-Open No. 2002-373945) discloses a semiconductor device featured by having a capacitance of MIM (Metal-Insulator-Metal) structure which is formed by the ALD method and which uses, as a capacitance insulating film, at least one material selected from $ZrO_2$, $HfO_2$, $(Zr_x, Hf_{1-x})O_2$ ($0<x<1$), $(Zr_y, Ti_{1-y})O_2$ ($0<y<1$), $(Hf_z, Ti_{1-z})O_2$ ($0<z<1$), and $(Zr_k, Ti_l, Hf_m)O_2$ ($0<k, l, m<1$ and $k+l+m=1$). Here, $(Zr_x, Hf_{1-x})O_2$ is an oxide of a solid solution of Zr and Hf, and $(Zr_y, Ti_{1-y})O_2$ is an oxide of a solid solution of Zr and Ti. Also, $(Hf_z, Ti_{1-z})O_2$ is an oxide of a solid solution of Hf and Ti, and $(Zr_k, Ti_l, Hf_m)O_2$ is an oxide of a solid solution of Zr, Ti and Hf. Further, the capacitance dielectric film in Patent Document 1 is used by being positively crystallized by annealing.

Patent Document 2 (Japanese Patent Laid-Open No. 2004-274067) discloses a forming method of a high dielectric constant oxide film $((Al_xHf_{1-x})O_y)$ formed by the ALD method. Here, an Al precursor and an Hf precursor are simultaneously injected into the reaction chamber of the ALD apparatus. Then, a reactant including Al and Hf at a predetermined composition ratio is vapor-deposited, so that Al and Hf are simultaneously oxidized to form $(Al_xHf_{1-x})O_y$.

Patent Document 3 (National Publication of International Patent Application No. 2004-511909) discloses an integrated circuit in which an interface layer is provided between a conductive material and a dielectric material, and in which the interface layer is selected from a group including an aluminum oxide and a lanthanide oxide and has a film thickness of about four monomolecular layers or less.

In view of the above described problems, it is desired to provide a dielectric film and a method for forming the dielectric film which can be applied to mass production of DRAM capacitor of 60 nm generation or later and in particular to mass production of DRAM capacitor of 45 nm level, and which has a high dielectric constant and a small leakage current.

SUMMARY

The present invention seeks to solve one or more of the above problems, or to improve upon those problems at least in part.

The present inventors have examined various dielectric films and have found out that the thermal stability of a dielectric film can be increased by alternately laminating hafnium oxide and titanium oxide at an atomic layer level, and that the crystallization of the dielectric film can be thereby suppressed at a temperature as high as about 600° C. even by annealing which is performed for reforming the film.

In one embodiment, there is provided a capacitor for a semiconductor device that includes an upper electrode, a lower electrode and a dielectric film therebetween, wherein the dielectric film includes an alternately laminated film of hafnium oxide and titanium oxide at an atomic layer level.

According to the present embodiment, it is possible to improve the thermal stability of the dielectric film, and possible to prevent the crystallization of the dielectric film at a temperature as high as about 600° C. even by annealing which is performed for reforming the film. As a result, it is possible to prevent a crack and a pinhole from being caused according to a volume change, or the like, during crystallization from the amorphous state, and thereby it is possible to reduce the leakage current.

According to the present embodiment, in the case where high temperature stability is required, it is possible to prevent the crystallization at a temperature of up to 700° C. or higher by adding a small amount of Al. As a result, it is possible to further reduce the leakage current and possible to obtain a dielectric film having high reliability and quality.

Further, the film formed by alternately laminating hafnium oxide and titanium oxide at an atomic layer level (hereinafter also referred to as $Hf_xTi_yO_z$) does not need to use a precursor having a low vapor pressure, such as Sr precursor, and hence the film is easily and industrially applicable.

Further, a material with a high dielectric constant, such as $TiO_2$ and $SrTiO_3$, has a narrow band gap. Thus, in the case where such material with high dielectric constant is used, a capacitor electrode needs to use a material, such as Pt, which enables a large band offset to be taken. In contrast, in the case where an $Hf_xTi_yO_z$ film is used, even when a conventional TiN electrode is used, it is possible to realize, in the same EOT, a small leakage current as compared with $TiO_2$, or the like.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
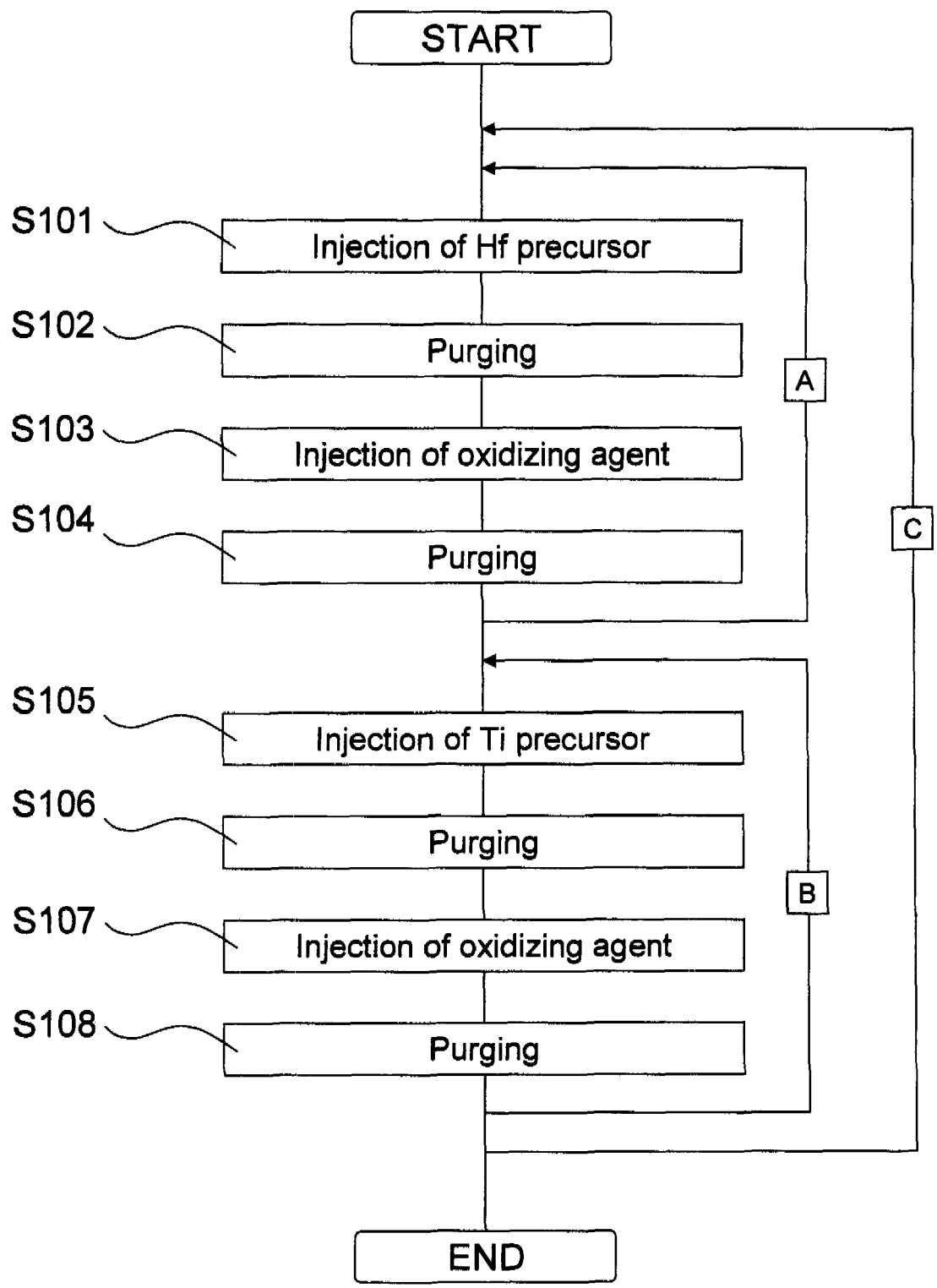
FIG. 1 is a sequence diagram showing manufacturing a dielectric film by an ALD method according to an exemplary embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In a first exemplary embodiment of the present invention, an amorphous film formed by laminating hafnium oxide ($HfO_2$) and titanium oxide ($TiO_2$) at an atomic layer level is used as a dielectric film of a DRAM capacitor.

Further, in the first exemplary embodiment of the present invention, an ALD (Atomic Layer Deposition) method is used to laminate hafnium oxide ($HfO_2$) and titanium oxide ($TiO_2$) at the atomic layer level, and a composition ratio between $HfO_2$ (dielectric constant 22) and $TiO_2$ (dielectric constant 80) can be adjusted by adjusting the number of times at which each of ALD cycles is performed. Thereby, a dielectric film having a desired effective dielectric constant is obtained on the basis of the adjustable range of the composition ratio.

Further, in the film formed by laminating hafnium oxide ($HfO_2$) and titanium oxide ($TiO_2$) at the atomic layer level, a crystallization temperature of 600° C. or higher is obtained in a case where the Hf concentration (Hf/(Hf+Ti)) is 10 atomic % or more. Thus, the crystallization can be prevented even when the film is subjected to the temperature of 600° C. during the annealing which is performed for reforming the film. Therefore, the film can be used in the amorphous state, and hence it is possible to suppress the increase in the leakage current due to the crystallization from the amorphous state.

That is, It is preferred that the film formed by alternately laminating hafnium oxide and titanium oxide at the atomic layer level has a composition ratio of Hf/(Hf+Ti)=10 to 45 atomic %.

Further, in a second exemplary embodiment of the present invention, it is possible to raise the crystallization temperature to 700° C. or higher by adding a small amount of $Al_2O_3$ layer in boundary surfaces of the film with upper and lower electrodes, or between the laminated layers of $HfO_2$ and $TiO_2$. Thereby, the thermal stability can be obtained with a minimum sacrifice of EOT (electrically investigated ETO). The dielectric film containing aluminum oxide has preferably the composition ratio expressed by Al/(Al+Hf+Ti) of 1 to 5 atomic %.

In the first exemplary embodiment, hafnium oxide ($HfO_2$) and titanium oxide ($TiO_2$) can be laminated at the atomic layer level by forming the dielectric film by the atomic layer deposition (ALD) method. Here, "atomic layer level" means to laminate 0.3 to 3 molecular layers of metal oxide ($HfO_2$ or $TiO_2$) by one cycle (including injecting a metal precursor, purging, injecting an oxidizing gas, and purging).

A structure of a capacitor manufactured by the first or second exemplary embodiment is not limited in particular, and can be applied to any of conventionally known structures, that is, a flat plate type structure, a three-dimensional structure (for example, crown type), and the like. Also, a known material can be used as the material of the upper and lower electrodes of the capacitor. However, in the first and second exemplary embodiments, in order to enable the performance of the dielectric film with high dielectric constant to be sufficiently exhibited, it is preferred to use a material, such as, metal nitride film, platinum group metal, and their oxides, which does not cause the dielectric constant of the dielectric film to be lowered due to the oxidization of the film. As the metal nitride film, there is listed a nitride film of a refractory metal. Examples of the metal nitride film include titanium nitride (TiN), tantalum nitride (TaN), tungsten nitride (WN), and the like. Further, examples of the platinum group metal include iridium (Ir), ruthenium (Ru), and the like, in addition to platinum (Pt) as a representative. Examples of the oxide of the platinum group metals include iridium oxide ($IrO_2$), ruthenium oxide ($RuO_2$), and further a composite oxide of a platinum group metal with the other metal, such as a perovskite type oxide (for example, $SrRuO_3$).

A DRAM is listed as an example of a semiconductor device provided with a capacitor according to the first and second exemplary embodiments, but the structure thereof is not limited in particular, and can be applied to a known DRAM structure. The first and second exemplary embodiments can be preferably used in a micro-fabricated DRAM of 60 nm generation or later, and can also be applied a DRAM of 45 nm generation or later.

Further, the capacitor of the first exemplary embodiment can be manufactured by the following manufacturing method that includes:

(1) forming a lower electrode;

(2) alternately laminating hafnium oxide and titanium oxide at an atomic layer level on the lower electrode by an atomic layer deposition (ALD) method; and (3) forming an upper electrode.

The above described laminating step (2) by the ALD method preferably includes: a hafnium oxide layer forming cycle (A) for repeating, for a required number of times, (A1) injecting an Hf precursor into a reaction chamber of an ALD apparatus, and forming a monolayer film of Hf compound on a substrate, (A2) purging the inside of the reaction chamber of the ALD apparatus, (A3) injecting an oxidizing gas into the reaction chamber of the ALD apparatus, and oxidizing the monolayer film of Hf compound, and (A4) purging the inside of the reaction chamber of the ALD apparatus; and a titanium oxide layer forming cycle (B) for repeating, for a required number of times, (B1) injecting a Ti precursor into the reaction chamber of the ALD apparatus, and forming a monolayer film of Ti compound on the substrate, (B2) purging the inside of the reaction chamber of the ALD apparatus, (B3) injecting an oxidizing gas into the reaction chamber of the ALD apparatus, and oxidizing the monolayer film of Ti compound, and (B4) purging the inside of the reaction chamber of the ALD apparatus, and a cycle (C) that is a combination of the cycle (A) and the cycle (B) is repeated for the number of times required for obtaining a dielectric film of a predetermined film thickness.

The number of times of the cycle (A) and the number of times of the cycle (B) are preferably adjusted so as to obtain a composition ratio of Hf/(Hf+Ti)=10 to 45 atomic %.

Further, to manufacturing a dielectric film of the second exemplary embodiment, the capacitor manufacturing method can further include the number of times of aluminum oxide layer forming cycles (D) which are required for satisfying Al/(Al+Hf+Ti)=1 to 5 atomic %, and each of which repeats, for a required number of times:

(D1) injecting an Al precursor into the reaction chamber of the ALD apparatus, and forming a monolayer film of Al compound on the substrate;

(D2) purging the inside of the reaction chamber of the ALD apparatus;

(D3) injecting an oxidizing gas into the reaction chamber of the ALD apparatus, and oxidizing the monolayer film of Al compound; and (D4) purging the inside of the reaction chamber of the ALD apparatus.

The cycle (D) can be performed in contact interfaces of the upper and lower electrodes with the dielectric film, and can be performed between the cycle (A) and the cycle (B).

In the following, the present invention will be described in more detail by using examples. However, the present invention is not limited to the examples, and a variety of modifications may of course be made within the scope and spirit of the present invention.

EXAMPLE 1

In the following, a technique according to the present invention will be described with reference to the accompanying drawings.

Figure 5:
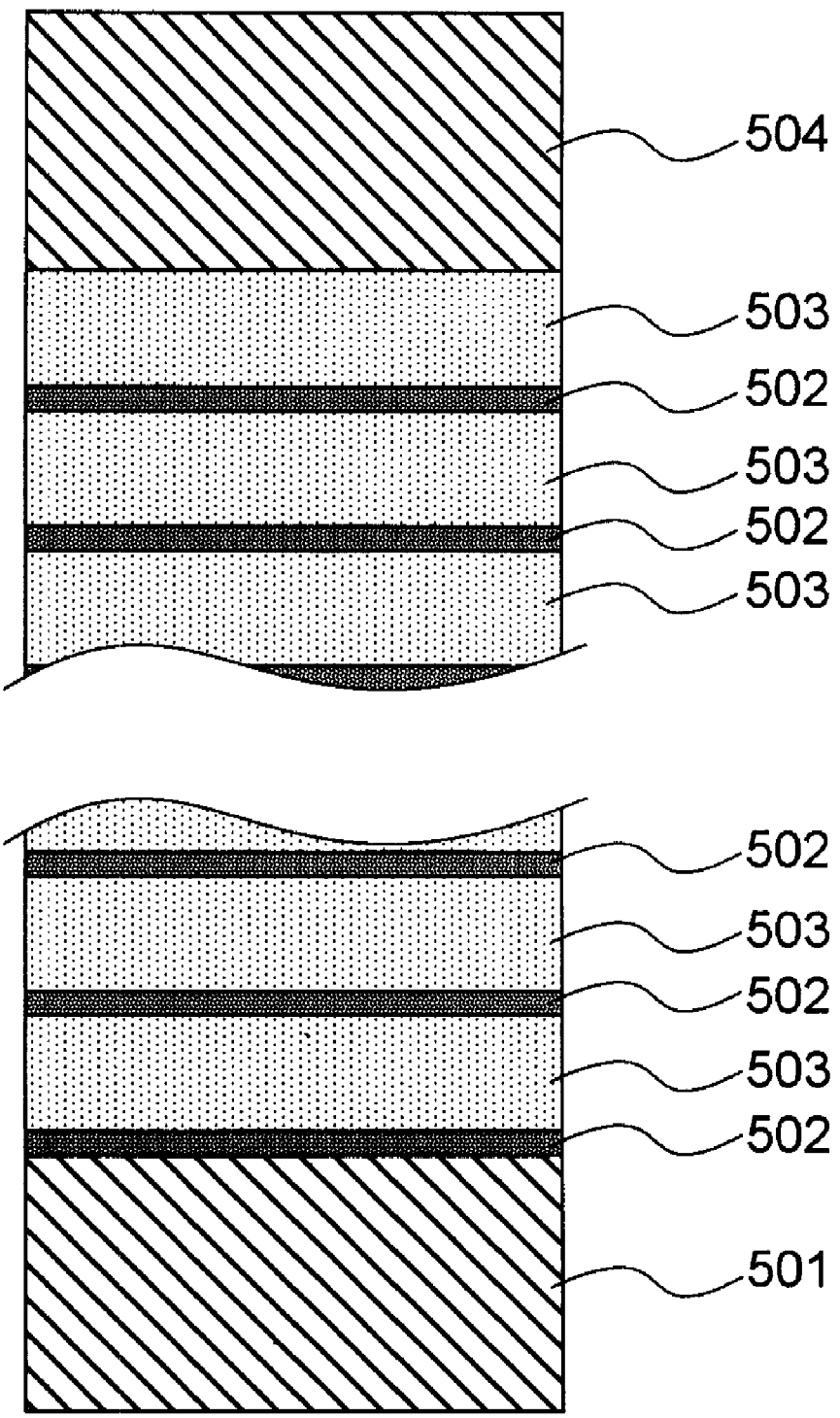
FIG. 5 is a schematic sectional view outlining a laminated structure of a capacitor which is a first exemplary embodiment according to the present invention.

In Example 1, a structure as shown in FIG. 5 is formed as a capacitor structure. That is, hafnium oxide layers 502 and titanium oxide layers 503 were laminated as a dielectric film on lower electrode 501, and then upper electrode 504 was formed. In the present example, titanium nitride (TiN) was used as lower electrode 501 and upper electrode 504. However, as described above, there may also be used a film of metal nitride, such as tantalum nitride (TaN) and molybdenum nitride (MoN), a film of platinum group metal, such as platinum (Pt) and a ruthenium (Ru), which enables a band offset to be easily taken with respect to the dielectric film, or a conductive oxide, such as $IrO_2$, $RuO_2$, and $SrRuO_3$.

The ALD method is used for laminating hafnium oxide layer 502 and titanium oxide layer 503. In the present example, the forming process was performed according to a sequence shown in FIG. 1.

That is, in step 101, an Hf precursor (TEMAH: tetrakis(ethylmethylamino)hafnium $(Hf[N(C_2H_5)CH_3]_4)$ is made to flow in the reaction chamber of the ALD apparatus for 60 seconds, to form a monomolecular layer of Hf compound. Next, in step 102, a cycle purge for repeating vacuum evacuation and injection of nitrogen gas ($N_2$) is performed for 60 seconds. In step 103, an oxidizing agent (for example, ozone ($O_3$)) is made to flow in the reaction chamber of the ALD apparatus for 60 seconds, to form a monomolecular layer of hafnium oxide. In step 104, the cycle purge is performed for 60 seconds. The above described steps are performed as cycle A for a predetermined number of times, to form hafnium oxide layer 502 having a desired thickness. Next, in step 105, a Ti precursor ($Ti(O-iPr)_4$ (titanium tetraisopropoxide)) is made to flow in the reaction chamber of the ALD apparatus, to form a monomolecular layer of Ti compound. Next, in step 106, the cycle purge is performed for 60 seconds. In step 107, ozone $O_3$ is made to flow in the reaction chamber for 60 seconds, to form a monomolecular layer of titanium oxide. In step 108, the cycle purge is performed for 60 seconds. The above described steps are performed as cycle B for a predetermined number of times, to form titanium oxide layer 503 having a desired thickness. That is, the composition ratio of Hf and Ti can be controlled by the ratio of the number of times of cycle A and cycle B.

Such composition control technique is often used to adjust a composition of $SrTiO_3$, and the like. Similarly, in the present example, the composition control technique was used as a method for controlling the composition of $Hf_xTi_yO_z$. In some cases, a clean monomolecular layer of $HfO_2$ may not be formed only by supplying the Hf precursor and ozone $O_3$. Further, similarly to the layer of $HfO_2$, a clean monomolecular layer of $TiO_2$ may not be formed only by supplying the Ti precursor and ozone $O_3$. In this case, even when the layers seem to be laminated by the sequence, there may be a case where the layers are not cleanly separated.

The lamination referred to as in the present example includes a mixed film (combinatorial film) of $HfO_2$ and $TiO_2$, which is formed in this case. However, also in this case, the film is different from $(Hf_z, Ti_{1-z})O_2$ as described in Patent Document 1 and is formed into a film having a concentration profile.

Then, the total thickness of the dielectric film is adjusted by performing cycle C for a predetermined number of times.

In the present example, TEMAH was used as the Hf precursor, and $Ti(O-iPr)_4$ was used as the Ti precursor. However, the source gases are not limited to these, and a known precursor may also be used. Further, ozone $O_3$ was used as the oxidizing agent, but $H_2O$ (water vapor), $O_2$ excited by plasma, and the like, may also be used.

Figure 12:
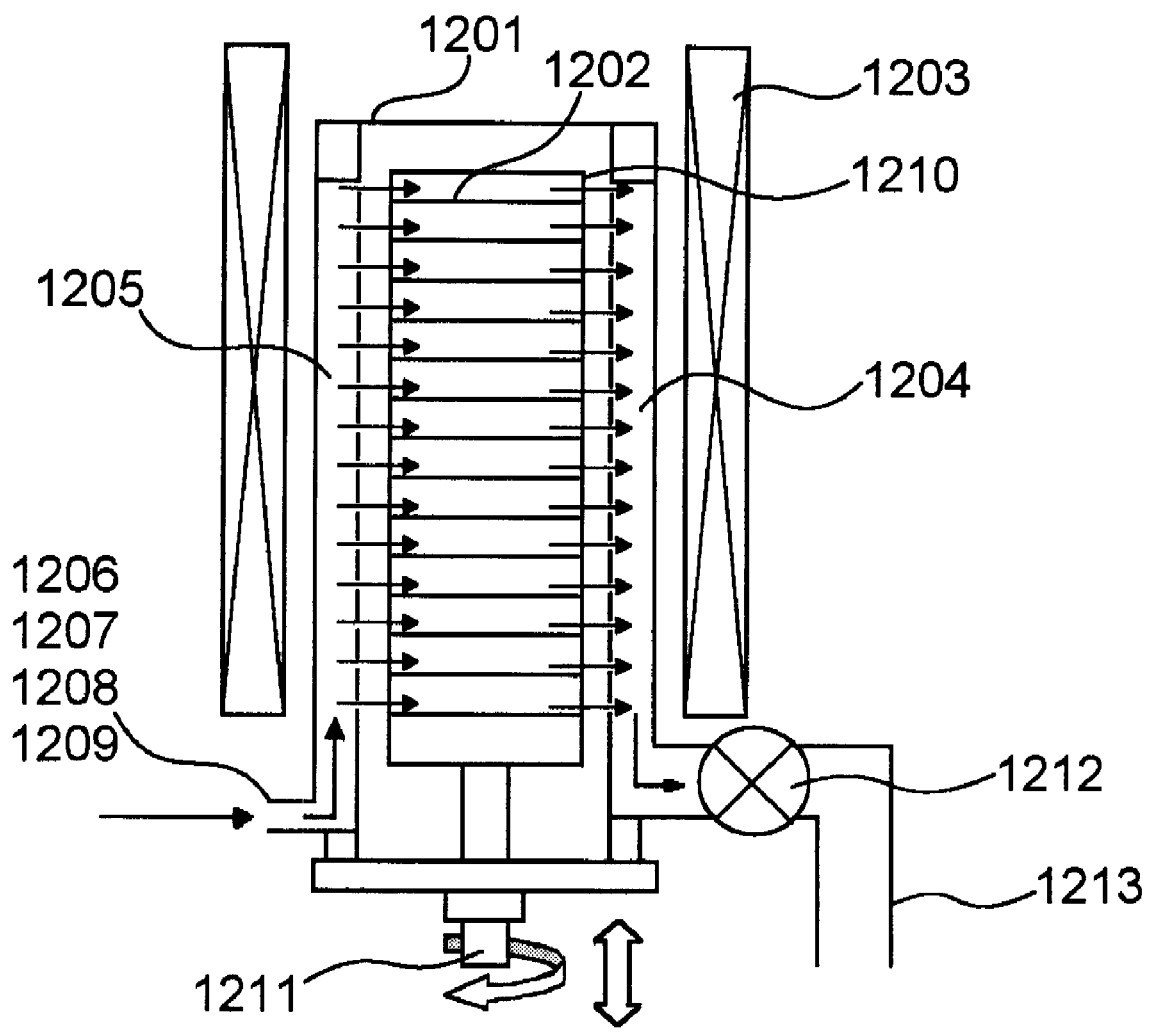
FIG. 12 is a schematic view of a batch type ALD apparatus.

A batch type apparatus as shown in FIG. 12 was used as the film forming apparatus. The inside of reaction chamber 1201 made of quartz is heated with heater 1203, and 100 sheets of wafers 1202 can be charged in boat 1210. Each gas is supplied to reaction chamber 1201 through injectors 1206 to 1209, and is exhausted with a pump (not shown) through exhaust chamber 1204 and through main bulb 1212 and exhaust port 1213.

It is configured such that a pair of the Hf precursor and $N_2$, a pair of the Ti precursor and $N_2$, and a pair of ozone ($O_3$) and $N_2$ are supplied from first injector (1206), second injector (1207), and third injector (1208), respectively. (In the figure, injectors 1206, 1207 and 1208 are collectively drawn as one injector.) Alternatively, it may also be configured such that one of the injectors is shared by an Hf precursor line and a Ti precursor line to enable the Hf precursor, the Ti precursor and $N_2$ to be supplied by first injector (1206), and that ozone ($O_3$) and nitrogen ($N_2$) can be supplied by the second injector.

A gas supply port from the injector is provided in correspondence with a wafer slot, and a laminar flow of reaction gas is obtained by also providing an exhaust port for each wafer slot, so that a film having excellent uniformity can be formed. Also, in order to further improve the uniformity in the film surface, boat 1210 is rotated about rotation axis 1211.

In the present example, the batch type film forming apparatus is used, but of course a single wafer type apparatus may also be used.

According to the sequence shown in FIG. 1, for each of the ALD cycles, the number of times of cycle A was set to one time (step 101 to step 104 were not repeated but performed one time), and the number of times of cycle B was changed from two to ten times, so that a sample having a physical film thickness of about 7 nm was formed. The film formation rate of each film depends on the apparatus configuration, the precursor which is used, and the time of each step of the sequence, and the like. The process temperature depends on the precursor which is used, but a temperature from about 260 to about 340° C. is preferred. In the present example, a temperature of 290° C. was used.

In a sample of the cycle ratio of A=1 and B=2, the concentration of Hf(Hf/(Hf+Ti)) was about 40 atomic % from a result of RBS (Rutherford Backscattering Spectrometry). When the sample was subjected to RTA (rapid thermal annealing) processing for one minute in an $N_2$ atmosphere at 600° C., the effective relative dielectric constant was about 32 (EOT=0.85 nm). Further, the electric field strength causing the leakage current density to become 1E-8 A/cm$^2$ in the sample was 2.0 MV/cm. Further, when the sample was subjected to the RTA processing for one minute in an $N_2$ atmosphere at 700° C., the effective dielectric constant was hardly changed to remain at 32 (EOT=0.85 nm), and the leakage current breakdown voltage was only slightly changed. In the sample which was not subjected to the heat treatment, the relative dielectric constant was 22 (EOT=1.24 nm), and the leakage breakdown voltage was 1.3 MV/cm.

In a sample of the cycle ratio of A=1 and B=3, the concentration of Hf was about 26 atomic %. When the sample was subjected to the RTA processing for one minute in the $N_2$ atmosphere at 600° C., the effective relative dielectric constant was about 36 (EOT=0.76 nm). Further, the electric field strength causing the leakage current density to become 1E-8 A/cm² in the sample was 1.8 MV/cm. Further, when the sample was subjected to the RTA processing for one minute in the N₂ atmosphere at 700° C., the effective dielectric constant was increased to become 41 (EOT=0.66 nm), and the leakage current breakdown voltage was deteriorated to 0.7 MV/cm. In the sample which was not subjected to the heat treatment, the relative dielectric constant was 24 (EOT=1.14 nm), and the leakage breakdown voltage was 1.0 MV/cm.

In a sample of the cycle ratio of A=1 and B=4, the concentration of Hf was about 21 atomic %. When the sample was subjected to the RTA processing for one minute in the N₂ atmosphere at 600° C., the effective relative dielectric constant was about 38 (EOT=0.72 nm). Further, the electric field strength causing the leakage current density to become 1E-8 A/cm² in the sample was 1.7 MV/cm. Further, when the sample was subjected to the RTA processing for one minute in the N₂ atmosphere at 700° C., the effective dielectric constant was increased to become about 60 (EOT=0.46 nm), and the leakage current breakdown voltage was deteriorated to 0.4 MV//cm. In the sample which was not subjected to the heat treatment, the relative dielectric constant was 24.4 (EOT=1.12 nm), and the leakage breakdown voltage was 0.8 MV/cm.

In a sample of the cycle ratio of A=1 and B=9, the concentration of Hf was about 10 atomic %. When the sample was subjected to the RTA processing for one minute in the N₂ atmosphere at 600° C., the effective relative dielectric constant was about 45 (EOT=0.61 nm). Further, the electric field strength causing the leakage current density to become 1E-8 A/cm² in the sample was 1.4 MV/cm. Further, when the sample was subjected to the RTA processing for one minute in the N₂ atmosphere at 700° C., the effective dielectric constant was increased to become about 74 (EOT=0.37 nm), and the leakage current breakdown voltage was deteriorated to 0.3 MV/cm. In the sample which was not subjected to the heat treatment, the relative dielectric constant was 27 (EOT=1.01 nm), and the leakage breakdown voltage was 0.4 MV/cm.

In a sample of the cycle ratio of A=1 and B=10, the concentration of Hf was about 8 atomic %. When the sample was subjected to the RTA processing for one minute in the N₂ atmosphere at 600° C., the effective relative dielectric constant was about 60 (EOT=0.46 nm). Further, the electric field strength causing the leakage current density to become 1E-8 A/cm² in the sample was 0.8 MV/cm. Further, when the sample was subjected to the RTA processing for one minute in the N₂ atmosphere at 700° C., the effective dielectric constant was increased to become about 76 (EOT=0.36 nm), and the leakage current breakdown voltage was deteriorated to 0.25 MV/cm. In the sample which was not subjected to the heat treatment, the relative dielectric constant was 28 (EOT=0.98 nm), and the leakage breakdown voltage was 0.2 MV/cm.

In the present example, the Hf concentration measured by RBS with the cycle ratio showed that Hf tends to be more easily contained (increased) on the side where the cycle ratio is near 1:1. Generally, it is considered that the relationship between the cycle ratio and the composition ratio depends on an apparatus configuration, a precursor which is used, and a film forming condition.

Further, it was confirmed that also in the case of A=2 and A=3, when the ratio of A and B is constant, it is possible to obtain the composition ratio almost equivalent to that in the case of A=1. Thus, the freedom in adjusting the composition ratio is further increased.

In this way, the samples of various composition ratios were created, and the relationship between the composition ratio, the relative dielectric constant, and the leakage breakdown voltage (the field strength causing the leakage current density to become 1E-8 A/cm²) was investigated. As a result, a graph shown in FIG. 13 was obtained.

When a dielectric film, after being formed as described above, was heat treated by a lamp annealer, and when the presence of crystallization in the dielectric film was investigated by XRD (X-ray diffraction), it was found that in the case of heat treatment in a nitrogen atmosphere at 700° C. for one minute, the crystallization (rutile type) was commenced at an Hf concentration less than 30 atomic %, and that in the case of heat treatment in a nitrogen atmosphere at 600° C., the crystallization was commenced at an Hf concentration less than 10 atomic %. Further, it was found that although the film forming temperature was 300° C., even when the film was not heat treated after being formed, the film was already crystallized at an Hf concentration less than 5 atomic %.

Figure 13:
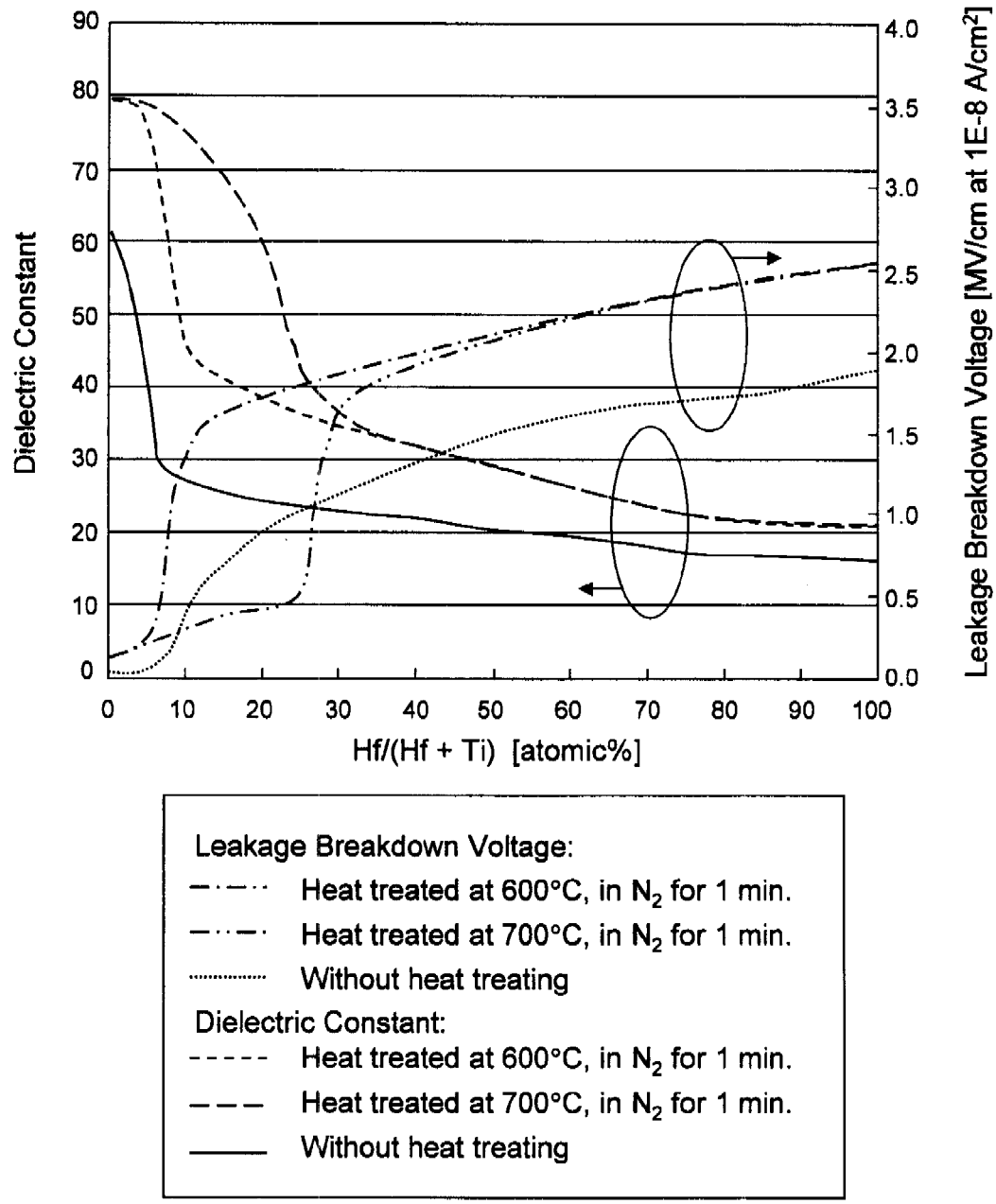
FIG. 13 shows a graph showing a relationship of Hf concentration of the dielectric film manufactured by using the present invention, with respect to the dielectric constant and the leakage breakdown voltage.

In view of the above results together with the characteristics in FIG. 13, it can be seen that a high dielectric constant can be obtained by crystallization, but that the leakage breakdown voltage is abruptly deteriorated by crystallization. Therefore, it was found that it was preferred to use the laminated film of TiO₂ and HfO₂ in an amorphous state in order to obtain excellent characteristics.

In the case where a sample in which the dielectric constant is 30 or more and in which the leakage current density at 1 V is suppressed to 1E-8 A/cm² or less is to be obtained in order to find out the superiority to other materials, the leakage breakdown voltage of about 1.4 MV/cm is required. The sample which is heat treated at 600° C. and contains the Hf concentration of 10 to 45 atomic %, satisfies this condition. When a sample is heat treated at 700° C., the sample having the Hf concentration of 30 to 45 atomic % satisfies this condition. However, in this sample, the superiority to the sample heat treated at 600° C. cannot be found. Further, when a sample is not heat treated, the sample has a large leakage current and a small dielectric constant. Thus, when the annealing is performed after the film formation, more excellent characteristics can be obtained. Further, according to the investigation of the present inventors, it was found that when the heat treatment after the film formation was performed at a temperature of 400° C. or higher, it was possible to obtain the characteristics equivalent to those in the case where the heat treatment is performed at a temperature of about 600° C.

By summarizing the above described results, it was found that a dielectric film obtained at an Hf concentration (Hf/(Hf+Ti)) of 10 to 45 atomic % and obtained by performing high-speed heat treatment (RTA) at a temperature of 400° C. to 600° C., was able to maintain an amorphous state and to have more excellent characteristics than those obtained by the conventional technique.

Thereafter, the capacitor was formed by forming upper electrode 504.

EXAMPLE 2

Figure 2:
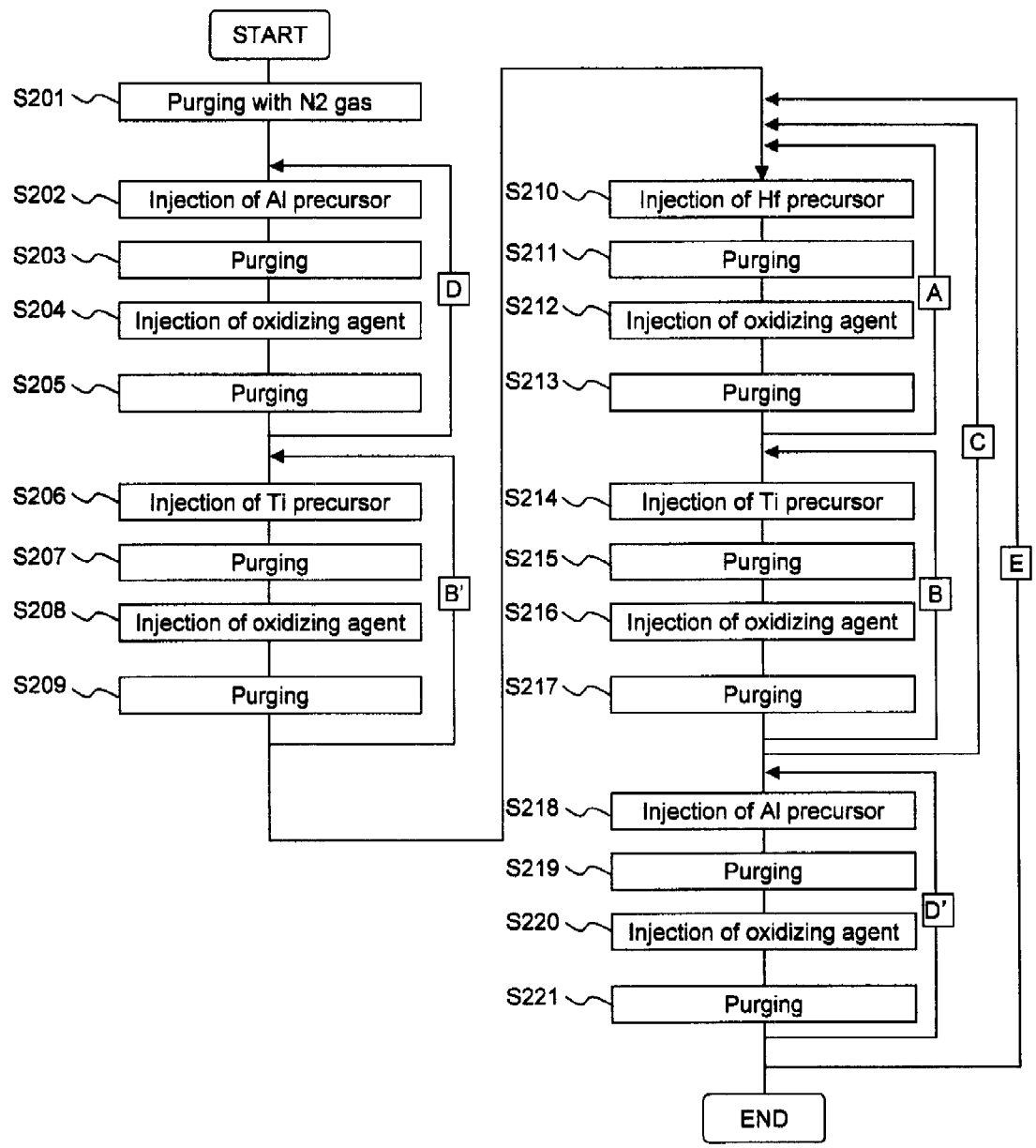
FIG. 2 is a sequence diagram showing manufacturing a dielectric film by the ALD method according to another exemplary embodiment of the present invention.
Figure 3:
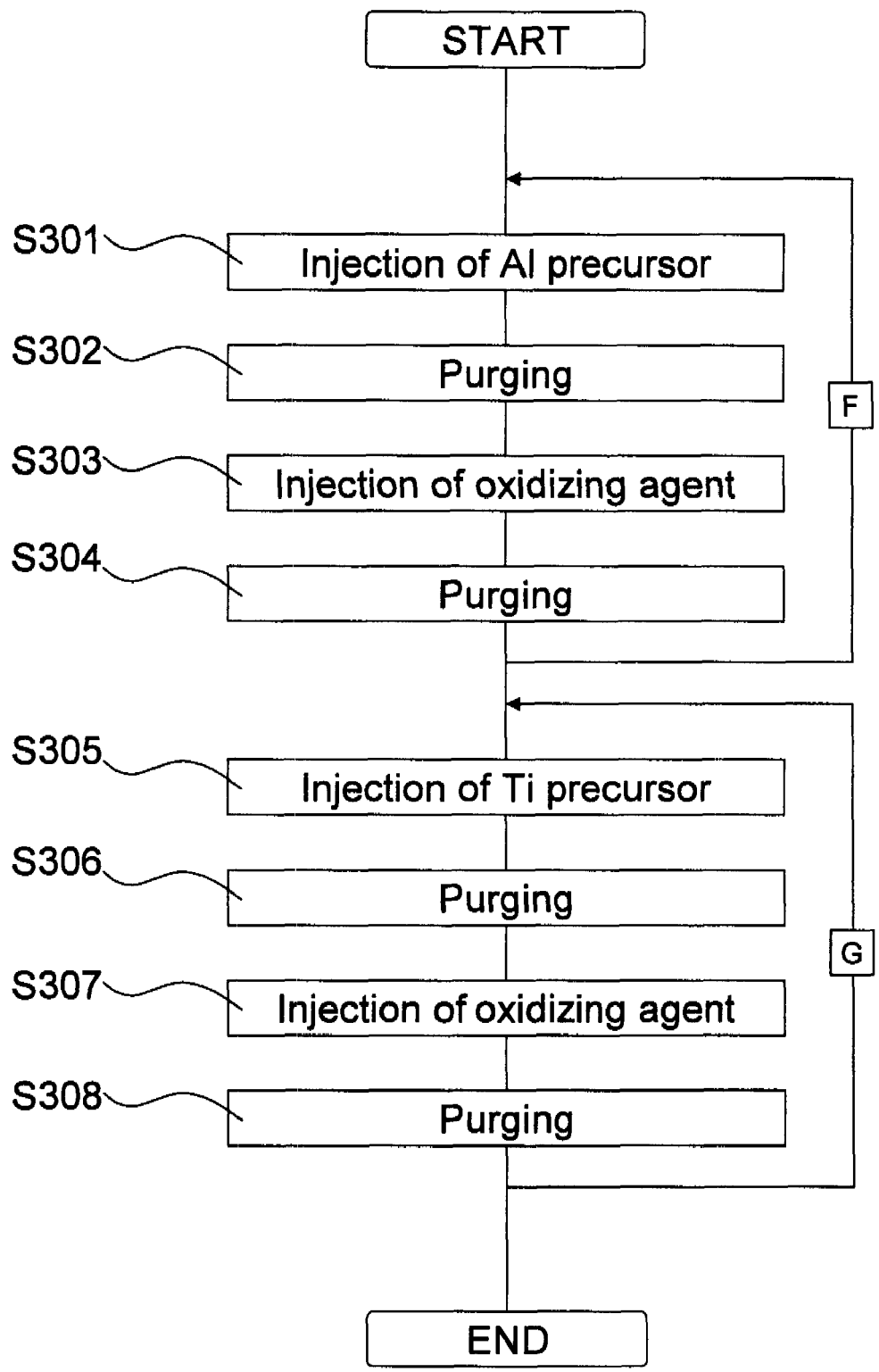
FIG. 3 is a sequence diagram showing manufacturing a dielectric film by the ALD method according to a related art form.
Figure 4:
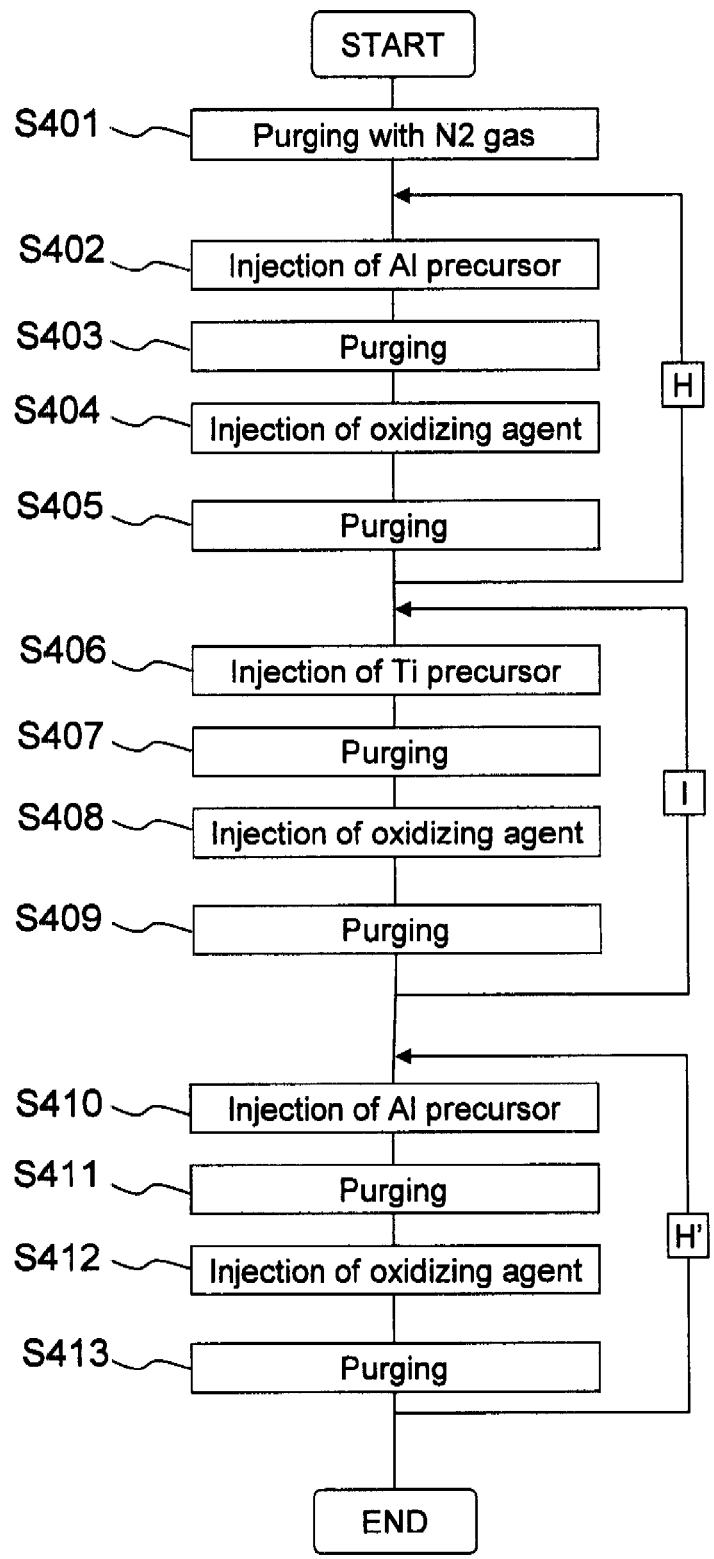
FIG. 4 is a sequence diagram showing manufacturing a dielectric film by the ALD method according to another related art form.
Figure 6:
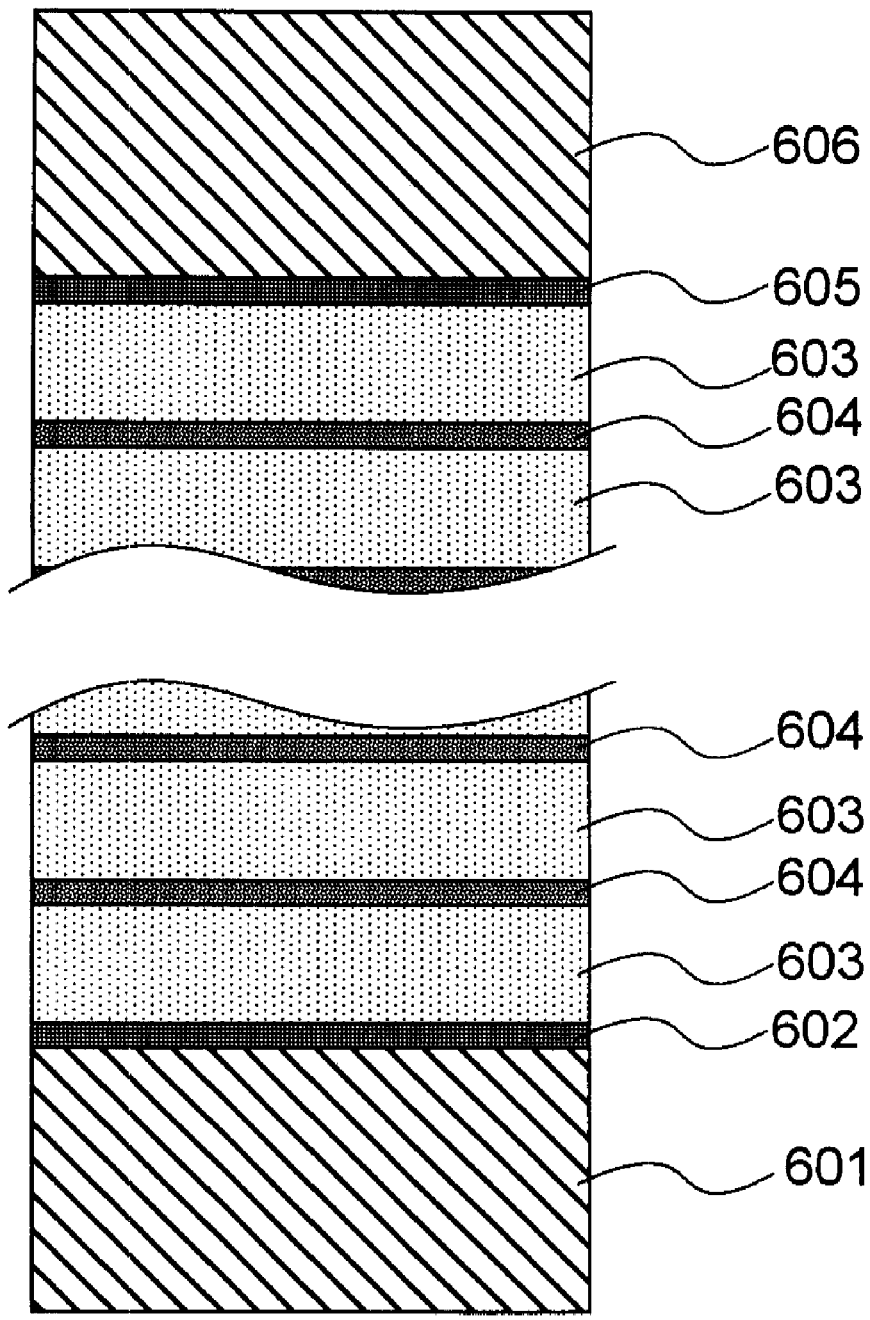
FIG. 6 is a schematic sectional view outlining a laminated structure of a capacitor which is a; second exemplary embodiment according to the present invention.
Figure 7:
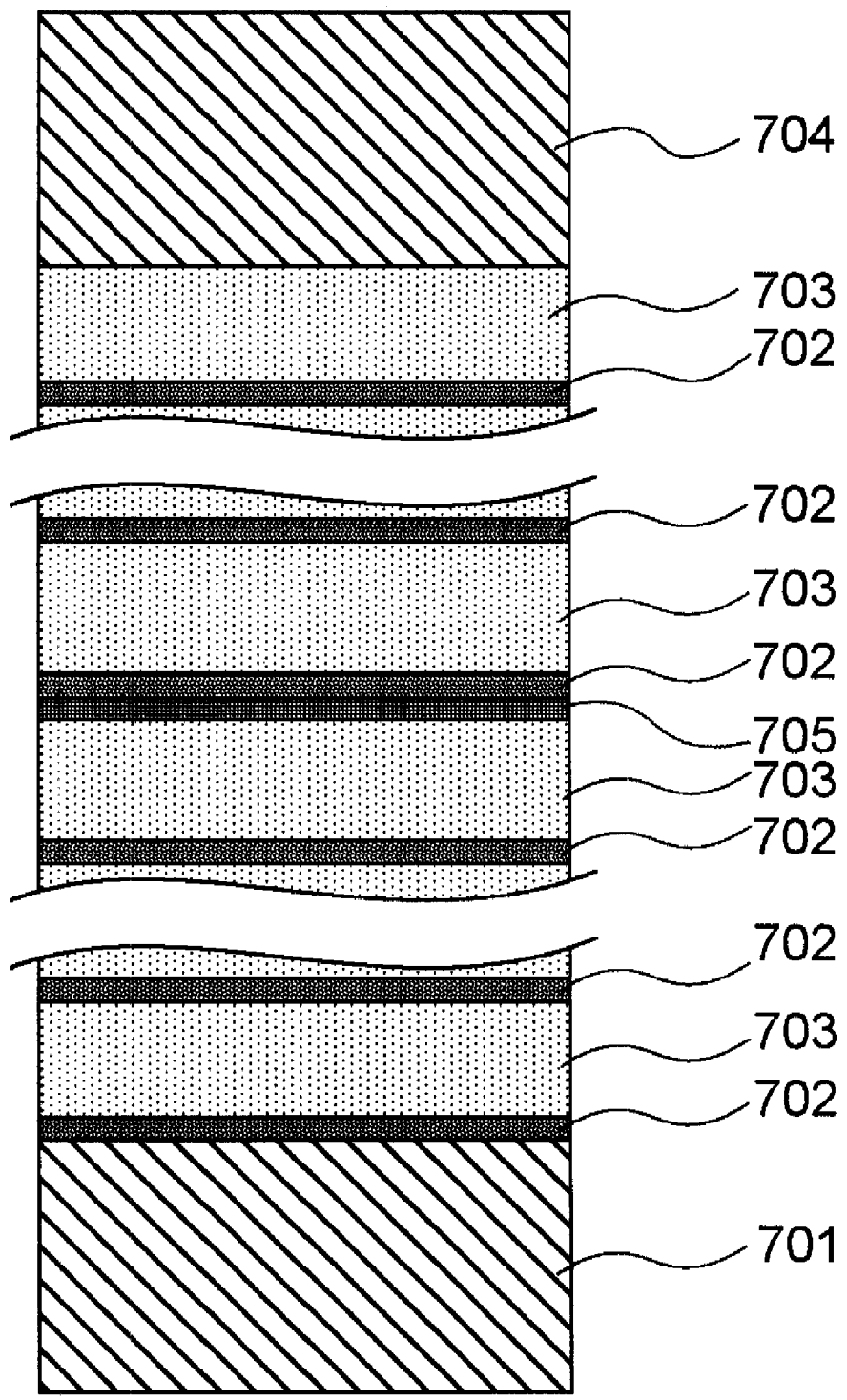
FIG. 7 is a schematic sectional view outlining a laminated structure of a capacitor which is a third exemplary embodiment according to the present invention.
Figure 8:
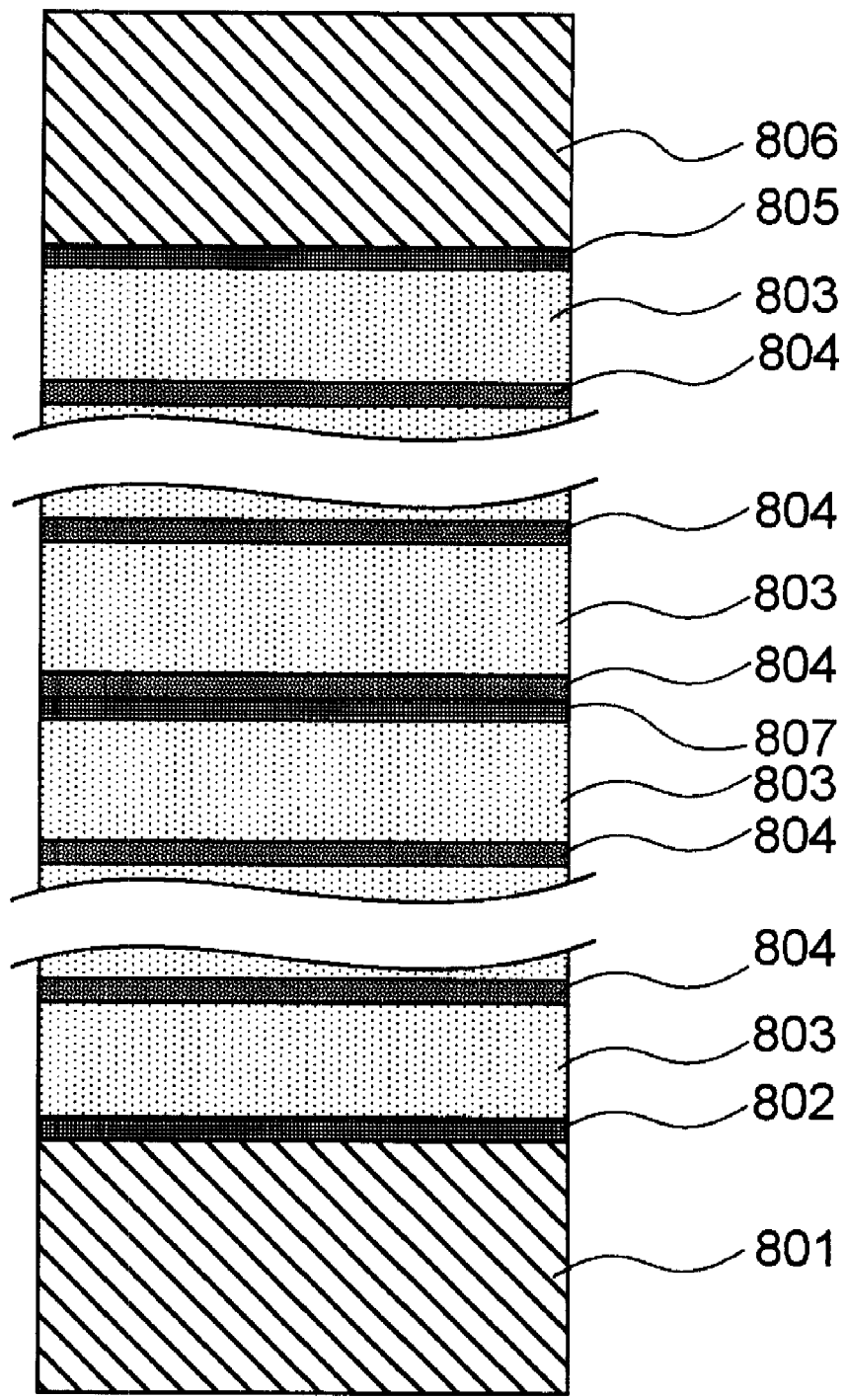
FIG. 8 is a schematic sectional view outlining a laminated structure of a capacitor which is a fourth exemplary embodiment according to the present invention.
Figure 9:
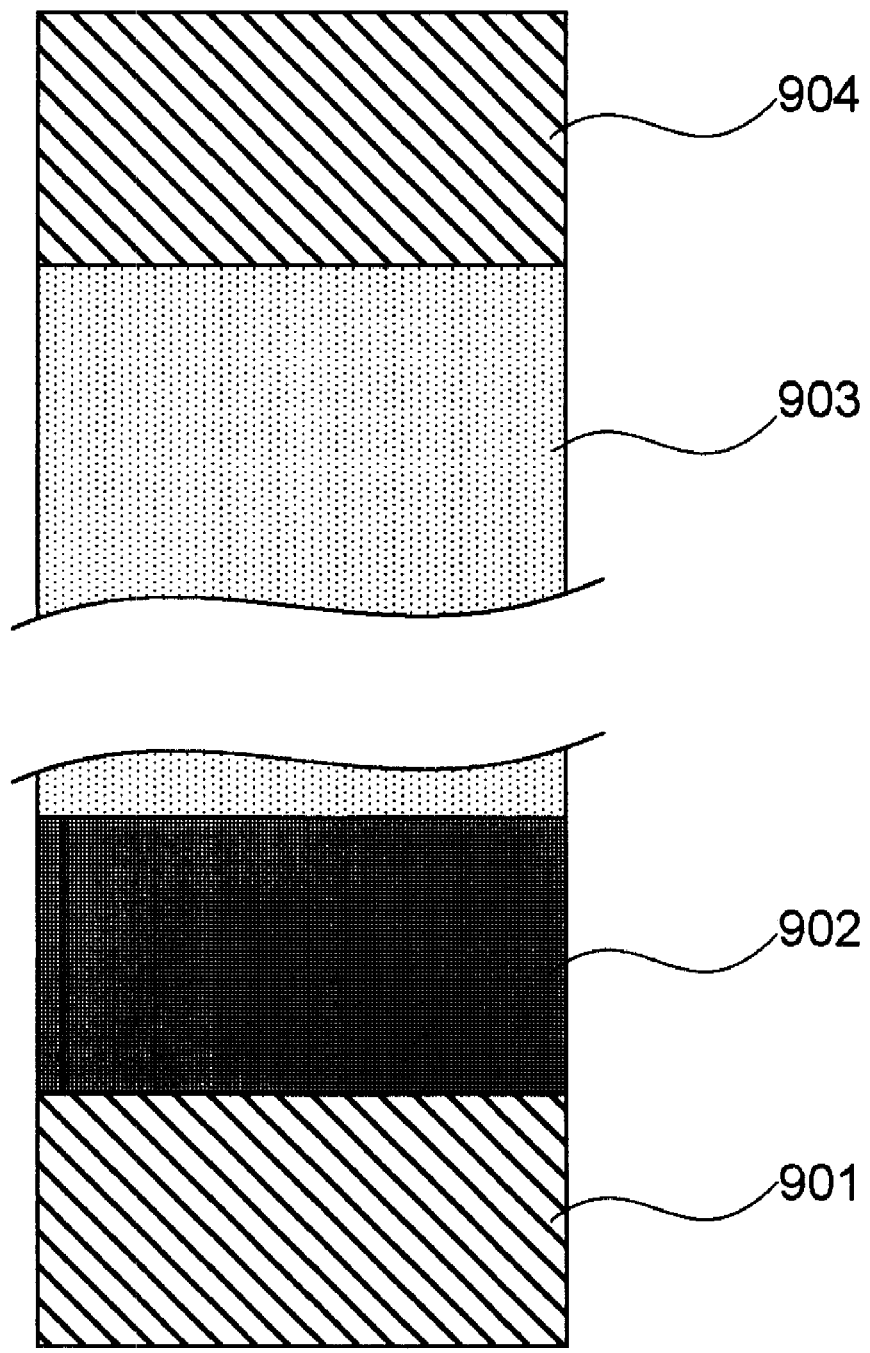
FIG. 9 is a schematic sectional view outlining a laminated structure of a capacitor of a related art form.
Figure 10:
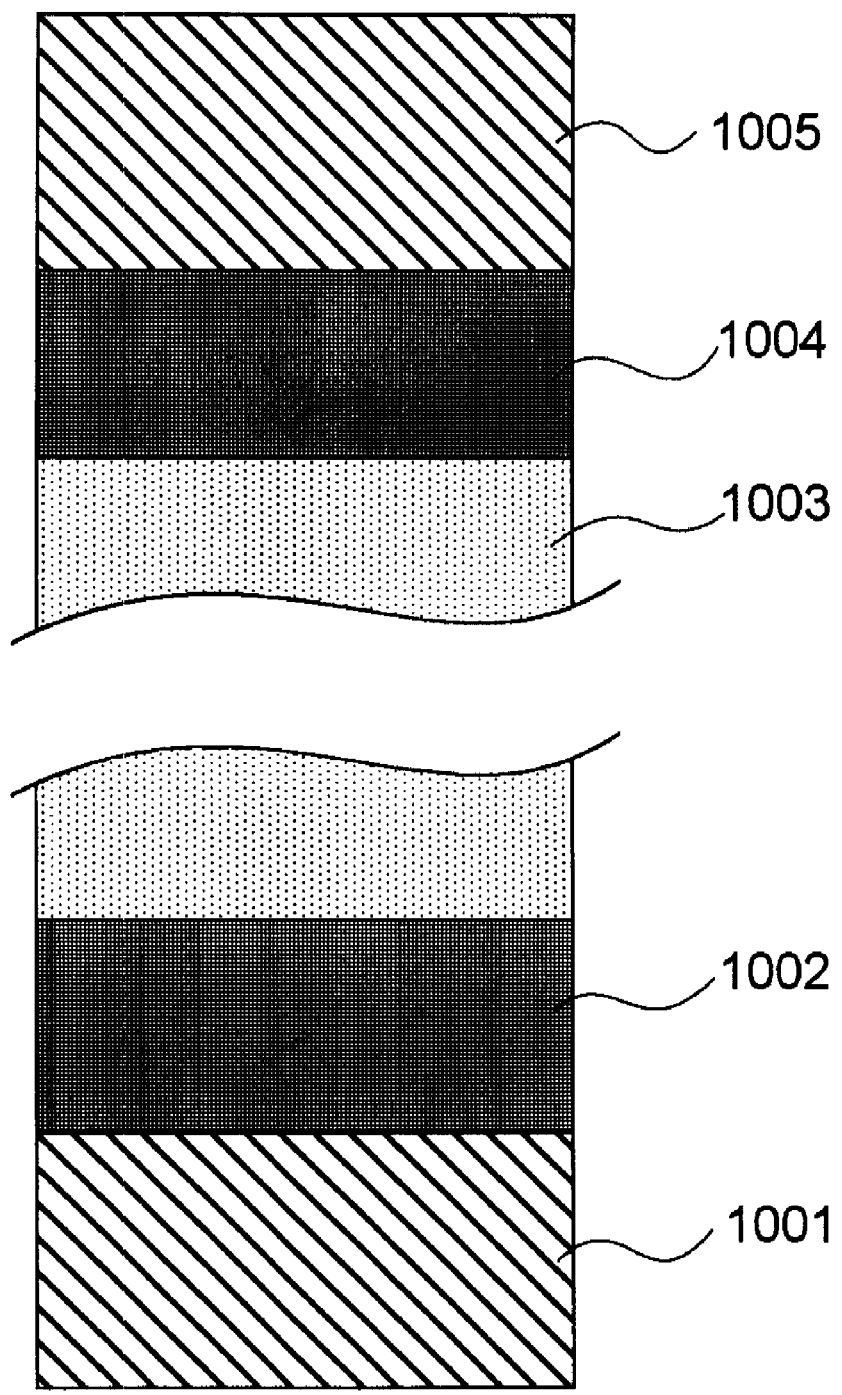
FIG. 10 is a schematic sectional view outlining a laminated structure of a capacitor of another related art form.
Figure 11:
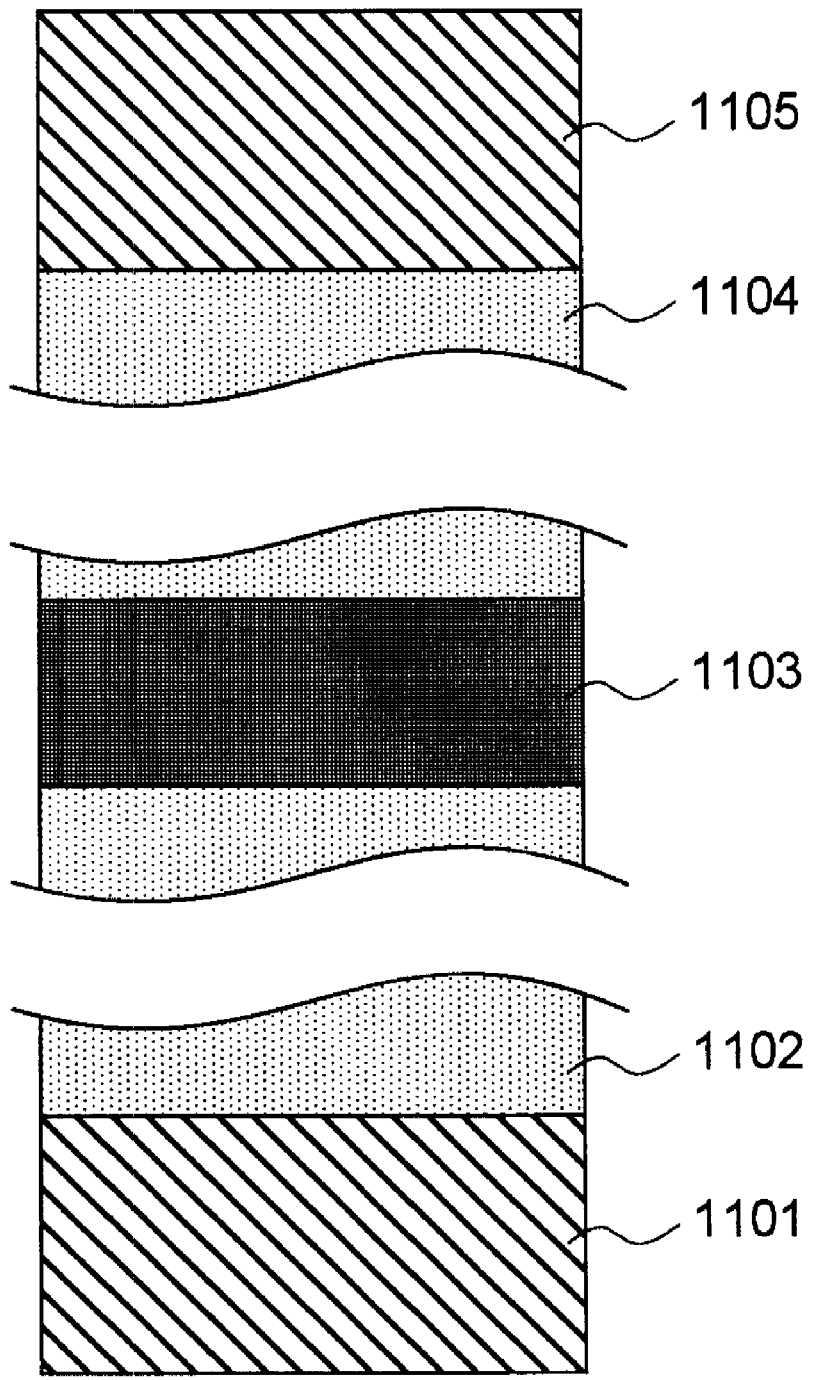
FIG. 11 is a schematic sectional view outlining a laminated structure of a capacitor of further another related art form.

By using the sequence shown in FIG. 2, lamination as shown in FIGS. 6, 7, and 8 is performed.

First, a structure shown in FIG. 6 will be described. The structure in FIG. 6 is different from the structure of example 1 in that $Hf_xTi_yO_z$ layers (titanium oxide layer: 603, hafnium oxide layer: 604) are sandwiched by lower layer of $Al_2O_3$ (602) and upper layer of $Al_2O_3$ (605). These $Al_2O_3$ layers (602, 605) are provided in order to suppress the reaction and mutual diffusion between $Hf_xTi_yO_z$ and the electrodes. For example, in the case where a capacitor, after being formed, is subjected to a thermal load, the deterioration of capacitor characteristics can be prevented by providing the $Al_2O_3$ layers on both sides of the capacitor. The film thickness of $Al_2O_3$ layers (602, 605) can be controlled by the number of times of cycles D and D', in the case where the number of times of cycle E in FIG. 2 is set to one time (the number of loop: 0). Usually, cycles D and D' are performed two to four times, respectively (0.27 nm to 0.36 nm). Although the EOT is sacrificed by the amount (about 0.3 nm of EOT), the above described technique is effective when the thermal stability of the capacitor is regarded as important. Here, TMA (Trimethyl-aluminum $Al(CH_3)_3$) was used as an Al precursor, but the present example is not limited to this. It is possible to list other known precursors, such as alkyl aluminum, alkoxy aluminum, and aluminum halide. In the case where the apparatus as shown in FIG. 12 is used, the apparatus may be configured such that the Al precursor and $N_2$ can be made to flow from fourth injector (1209).

Further, in the case where a capacitor, after being formed, is subjected to a thermal load at a temperature of 700° C. or higher, an $Al_2O_3$ layer may also be formed in the $Hf_xTi_yO_z$ layer. For example, the thermal stability of the capacitor can be improved by forming only one $Al_2O_3$ monomolecular layer of several nanometers (by performing step 218 to step 221 one time) during the formation of the $Hf_xTi_yO_z$ layers (cycle C) in the sequence shown in FIG. 2. Thereby, the capacitor can be prevented from being crystallized even by being subjected to the thermal load at the temperature of about 700° C. Further, the effect that the leakage current is further reduced by adding a small amount of Al, was also recognized. For example, a sample having a physical film thickness of about 7 nm and formed at the Al concentration (Al/(Al+Hf+Ti)) adjusted to 2 atomic %, at the Hf concentration (Hf/(Al+Hf+Ti)) adjusted to 13 atomic %, and at the Ti concentration (Ti/(Al+Hf+Ti)) adjusted to 85 atomic %, was not crystallized after being heat treated by the RTA at a temperature of 700° C. for one minute, and showed that the relative dielectric constant was 37 (EOT=0.74 nm), and that the leakage breakdown voltage (the field strength causing the leakage current density to become $1E-8$ $A/cm^2$) was 1.7 MV/cm.

Note that FIG. 7 shows a structure in which $Al_2O_3$ layer (705) is added to the structure in FIG. 5, and which was formed in such a way that cycle D and cycle B' in the sequence shown in FIG. 2 were omitted, that cycle D' was performed at a rate of one time for each laminated film thickness of several nanometers in cycle C, and that cycle D' was finally omitted. Further, FIG. 8 shows a structure in which $Al_2O_3$ layer (807) is added to the structure shown in FIG. 6.

The film stability is improved as the concentration of $Al_2O_3$ is increased, but the dielectric constant is significantly reduced by the presence of $Al_2O_3$. Thus, it is important that the amount of $Al_2O_3$ is not increased more than necessary. An Al concentration [Al/(Al+Hf+Ti)] of about 1 to 5 atomic % is sufficient.

As described above, the composition of $Hf_xTi_yO_z$ can be easily, if not freely, adjusted by using a nanolaminate film formed by the ALD method, and the film quality of $Hf_xTi_yO_z$ can be controlled between $HfO_2$ and $TiO_2$.

Generally, there is a trade-off relation between leakage current and EOT. However, $Hf_xTi_yO_z$ according to the present invention is suitable as a dielectric material for a DRAM capacitor of 60 nm generation or later, because EOT can be effectively reduced by adjusting the composition of $Hf_xTi_yO_z$ such that Hf/(Hf+Ti)=10 to 45 atomic %.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A capacitor for a semiconductor device comprising an upper electrode, a lower electrode and a dielectric film therebetween, wherein the dielectric film comprises an alternately laminated film of hafnium oxide and titanium oxide at an atomic layer level.

2. The capacitor according to claim 1, wherein the alternately laminated film of hafnium oxide and titanium oxide at an atomic layer level has a composition ratio of Hf/(Hf+Ti) =10 to 45 atomic %.

3. The capacitor according to claim 1, wherein the alternately laminated film of hafnium oxide and titanium oxide at an atomic layer level is in an amorphous state.

4. The capacitor according to claim 1, wherein the dielectric film further comprises aluminum oxide at a composition ratio of Al/(Al+Hf+Ti)=1 to 5 atomic %.

5. The capacitor according to claim 4, wherein the aluminum oxide is formed in a layer shape in contact interfaces of the upper and lower electrodes with the dielectric film.

6. The capacitor according to claim 4, wherein the aluminum oxide is formed between the layer of hafnium oxide and the layer of titanium oxide.

7. The capacitor according to claim 1, wherein the dielectric film has a dielectric constant of 30 or more and a leakage current density of $1E-8$ $A/cm^2$ or less at 1 V.

8. A semiconductor device including the capacitor according to claim 1.

9. The semiconductor device according to claim 8, wherein the semiconductor device is a DRAM.

10. A semiconductor device including the capacitor according to claim 2.

11. The semiconductor device according to claim 10, wherein the semiconductor device is a DRAM.

12. A semiconductor device including the capacitor according to claim 3.

13. The semiconductor device according to claim 12, wherein the semiconductor device is a DRAM.

14. A semiconductor device including the capacitor according to claim 4.

15. The semiconductor device according to claim 14, wherein the semiconductor device is a DRAM.

16. A semiconductor device including the capacitor according to claim 5.

17. The semiconductor device according to claim 16, wherein the semiconductor device is a DRAM.

18. A semiconductor device including the capacitor according to claim 6.

19. The semiconductor device according to claim 18, wherein the semiconductor device is a DRAM.

20. A semiconductor device including the capacitor according to claim 7.

21. The semiconductor device according to claim 20, wherein the semiconductor device is a DRAM.

22. A method for manufacturing a capacitor for a semiconductor device comprising:
(1) forming a lower electrode;
(2) alternately laminating hafnium oxide and titanium oxide at an atomic layer level on the lower electrode by an atomic layer deposition (ALD) method; and
(3) forming an upper electrode.

23. The method according to claim 22, wherein the laminating step (2) by the ALD method includes:
a hafnium oxide layer forming cycle (A) which repeats, for a required number of times, (A1) injecting an Hf precursor into a reaction chamber of an ALD apparatus, and forming a monolayer film of Hf compound on a substrate,
(A2) purging the inside of the reaction chamber of the ALD apparatus,
(A3) injecting an oxidizing gas into the reaction chamber of the ALD apparatus, and oxidizing the monolayer film of Hf compound, and
(A4) purging the inside of the reaction chamber of the ALD apparatus; and
a titanium oxide layer forming cycle (B) which repeats, for a required number of times,
(B1) injecting a Ti precursor into the reaction chamber of the ALD apparatus, and forming a monolayer film of Ti compound on the substrate,
(B2) purging the inside of the reaction chamber of the ALD apparatus,
(B3) injecting an oxidizing gas into the reaction chamber of the ALD apparatus, and oxidizing the monolayer film of Ti compound, and
(B4) purging the inside of the reaction chamber of the ALD apparatus, and
wherein a cycle (C) which is a combination of the cycle (A) and the cycle (B) is repeated for the number of times required for obtaining a dielectric film of a predetermined thickness.

24. The method according to claim 23, wherein the number of times of the cycle (A) and the number of times of the cycle (B) are adjusted to satisfy Hf/(Hf+Ti)=10 to 45 atomic %.

25. The method according to claim 22, further comprising the number of times of aluminum oxide layer forming cycles (D) which are required for satisfying Al/(Al+Hf+Ti)=1 to 5 atomic %, and each of which repeats, for a required number of times,
(D1) injecting an Al precursor into the reaction chamber of the ALD apparatus, and forming a monolayer film of Al compound on the substrate;
(D2) purging the inside of the reaction chamber of the ALD apparatus;
(D3) injecting an oxidizing gas into the reaction chamber of the ALD apparatus, and oxidizing the monolayer film of Al compound; and
(D4) purging the inside of the reaction chamber of the ALD apparatus.

26. The method according to claim 25, wherein the cycle (D) is performed in contact interfaces of the upper and lower electrodes with a dielectric film.

27. The method according to claim 25, wherein the cycle (D) is performed between the cycle (A) and the cycle (B).

28. The method according to claim 24, further comprising high-speed heat treatment which is performed in a temperature range of 400 to 600° C. after the dielectric film is formed.

29. The method according to claim 25, further comprising high-speed heat treatment which is performed in a temperature range of 400 to 700° C. after a dielectric film is formed.

* * * * *